United States Patent [19]

Simpson

[11] Patent Number: 4,739,499
[45] Date of Patent: Apr. 19, 1988

[54] RANDOM ACCESS MEMORY USING SEMICONDUCTOR DATA STORAGE ELEMENTS

[75] Inventor: Richard D. Simpson, Carlton, England

[73] Assignee: Texas Instruments Incorporated, Dallas, Tex.

[21] Appl. No.: 838,495

[22] Filed: Mar. 11, 1986

[30] Foreign Application Priority Data

Mar. 18, 1985 [GB] United Kingdom ............... 8506949

[51] Int. Cl.[4] .............................................. G11C 7/00
[52] U.S. Cl. .................................. 365/205; 365/203
[58] Field of Search ................ 365/154, 190, 203, 205

[56] References Cited

U.S. PATENT DOCUMENTS 4,412,143  10/1983  Patella et al. ...................... 365/205
4,627,033  12/1986  Hyslop et al. ...................... 365/205

Primary Examiner—James W. Moffitt
Attorney, Agent, or Firm—Gary Honeycutt; Melvin Sharp; Rhys Merrett

[57] ABSTRACT

A CMOS random access memory has storage elements (1, 2 and 3) which produce complementary outputs on a pair of output conductors (7, 8). In order to speed up the establishment of the output voltages on the conductors two cross-connected transistors (22, 23) are provided to supplement the discharging of that conductor which is to have the lower voltage, each transistor being responsive to the voltage on one conductor to discharge the other conductor. The correct timing of the operation of the cross-connected transistors is provided by two further transistors (26, 27) having their gates respectively connected to the conductors which are arranged to become conducting when an adequate voltage charge has been achieved by the storage element. When either of the further transistors conducts a transistor (24) in series with the two cross-connected transistors is turned on to enable them to operate.

6 Claims, 1 Drawing Sheet

U.S. Patent
Apr. 19, 1988
4,739,499
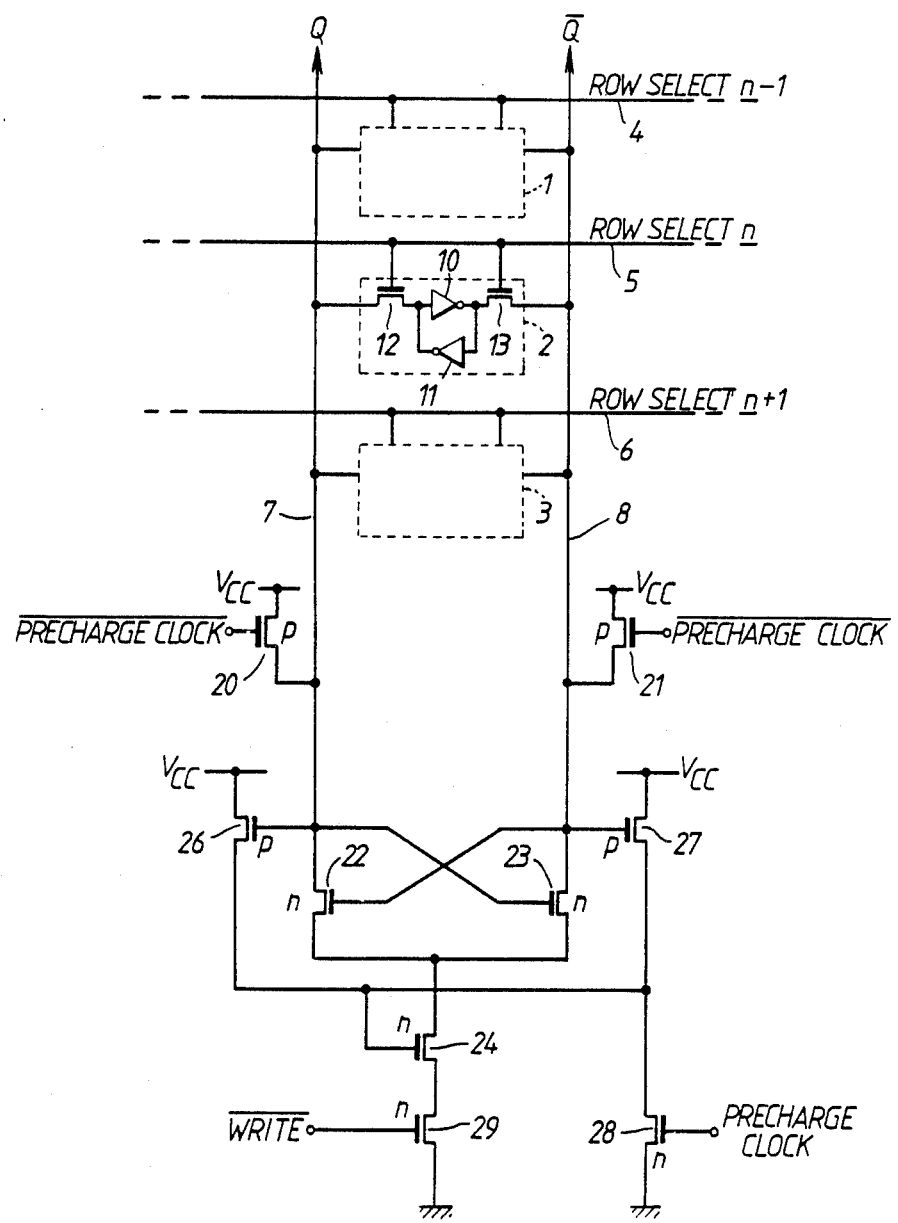

RANDOM ACCESS MEMORY USING SEMICONDUCTOR DATA STORAGE ELEMENTS

This invention relates to a random access memory using semiconductor data storage elements using CMOS circuits.

BACKGROUND OF THE INVENTION

In a typical CMOS random access memory formed in an integrated circuit the normal and complementary outputs of an addressed data storage element to be read are connected to normal and complementary output conductors of which one is discharged from a voltage level to which both were previously charged, which conductor is discharged depending on whether the bit stored in the addressed element is a "1" or a "0". The rate of discharge is relatively slow and therefore to speed up the establishment of voltages representing the stored bit on the conductors a pair of transistors is provided, each discharging one conductor at a rate depending on the voltage on the other conductor, thereby causing the conductor having the lower voltage to be discharged more quickly than that having the higher voltage. Thus the output conductors rapidly assume distinct voltages corresponding to the bit stored in the addressed element. It is, however, important that the cross-connected pair of transistors is not switched into circuit before a certain minimum difference between the voltages on the conductors has been set up by the addressed storage element, otherwise there would be a risk that the final voltages on the conductors did not clearly and accurately represent the bit from the addressed storage element. To this end, the current paths through the pair of transistors are commoned and passed through a further transistor the conductivity of which is controlled by a sense clock signal, the timing of which is controlled to permit at least the required minimum difference between the conductor voltages to be set up before the cross-connected pair of transistors become effective. The invention is concerned with the timing of the sense clock signal which must not be too early to avoid corruption of the data and if it is unnecessarily late it will undesirably increase the access time of the memory.

It is an object of the present invention to overcome the above difficulty.

SUMMARY OF THE INVENTION

According to the present invention there is provided a random access memory having a plurality of data storage elements each able to store one bit of data and to produce complementary output current signals representing the stored bit when addressed, a pair of output conductors respectively for receiving the complementary output signals, means for charging the output conductors to a predetermined voltage and a pair of MOS transistors each connected to discharge a respective output conductor in response to the voltage on the other output conductor after the output signals from an addressed storage element have been applied to the output conductors thereby to discharge fully the voltage on that one of the output conductors having the lower voltage due to the output signals from the addressed storage element, wherein there are provided means responsive to the voltages on the output conductors due to the output signals from an addressed storage element to enable the pair of transistors to pass current when the voltages on the output conductors have reached values capable of causing reliable switching of the pair of transistors.

The means responsive to the voltages on the output conductors may include a second pair of MOS transistors having their gates respectively connected to the output conductors and, their sources connected to a reference voltage substantially equal to the predetermined voltage, so that one or other of the second pair of transistors becomes conducting when the voltage on the corresponding output conductor has reached a value ensuring reliable switching of the first mentioned pair of transistors. The drains of the second pair of transistors may be precharged and connected to the gate of a further transistor controlling the current paths through the first-mentioned pair of transistors, the precharge preventing the further transistor conducting until it is discharged by one or other of the second pair of transistors.

Each data storage element includes MOS transistors and is constructed as a CMOS circuit.

BRIEF DESCRIPTION OF THE DRAWING

In order that the invention may be fully understood and readily carried into effect it will now be described with reference to an example shown in the random access memory diagram of the accompanying drawing.

DESCRIPTION OF THE PREFERRED EMBODIMENT

The FIGURE shows at 1, 2 and 3 data storage elements in rows n−1, n and n+1 in one column of a random access memory suitable for construction at an integrated circuit. Each of the storage elements shown has two connections to an associated one of the three row select conductors 4, 5 and 6, and a connection to each of two column conductors 7 and 8, respectively for upright and inverted data signals Q and $\overline{Q}$. The storage elements are of the same construction and only that of the element 2 is shown, consisting of two CMOS inverter circuits 10 and 11 in regenerative connection joined by single MOS transistors 12 and 13 respectively to the column conductors 7 and 8. The gates of the transistors 12 and 13 are connected to the associated row select conductor 5.

The conductors 7 and 8 are connected to a reference voltage $V_{cc}$ through respective PMOS transistors 20 and 21 which are rendered conducting by a signal $\overline{\text{PRECHARGE CLOCK}}$ applied to their gates. NMOS transistors 22 and 23 are connected from the conductors 7 and 8 respectively to a further NMOS transistor 24 through which they are connected via a further NMOS transistor 29 controlled by a $\overline{\text{WRITE}}$ signal to ground. The gates of the transistors 22 and 23 are respectively connected to the conductors 8 and 7. Two other PMOS transistors 26 and 27 are connected from the voltage $V_{cc}$ to the gate of the transistor 24, which is connected to ground through an NMOS transistor 28, arranged to be rendered conducting by a signal PRECHARGE CLOCK applied to its gate.

In the operation of the circuit shown in the FIGURE, the storage elements 1, 2 and 3 receive from means not shown signals representing respective bits to be stored via the conductors 7 and 8 when row select signals are applied one at a time to the row select conductors 4, 5 and 6. At this time the WRITE signal is low making transistor 29 non-conducting and the signal $\overline{\text{PRECHARGE CLOCK}}$ is low and the signal $\overline{\text{PRE-}}$ CHARGE CLOCK is high, so that transistor 28 and transistors 20 and 21 are not conducting isolating the conductors 7 and 8 from the voltage $V_{cc}$. Because the transistor 28 is non-conducting the gate of transistor 24 is high so that it does conduct but no current can flow through it because transistor 29 is non-conducting. This means that the conductors 7 and 8 are free to assume the voltages applied to them by the external means to enable the required binary data to be written into the storage elements.

When data is to be read from a storage element, the signal PRECHARGE CLOCK goes low, causing the conductors 7 and 8 to be charged substantially to the voltage $V_{cc}$, and the signal PRECHARGE CLOCK goes high, switching on the transistor 28, and bringing the gate of the transistor 24 to ground potential, because with the conductors 7 and 8 at $V_{cc}$ the transistors 26 and 27 are non-conducting. The PRECHARGE CLOCK and PRECHARGE CLOCK signals now become low and high respectively leaving the transistors 20, 21 and 28 nonconducting. The signal WRITE goes high rendering the transistor 29 conducting. Suppose the bit is to be read from the storage element 2, then a row select signal is applied to the conductor 5 causing the transistors 12 and 13 to become conducting. Depending on the bit stored in the element 2 a current will be drawn from one of the conductors 7 and 8 and substantially no current from the other. The current drawn is small, because the devices constituting the element 2 are small, and it would need to be allowed to flow for a relatively long time (more than a microsecond) to produce voltages on the conductors 7 and 8 which could be used as output signals representing the stored bit in a standard digital signal convention (e.g. 0–2.5 volts for "0" and 3.5–5.0 volts for "1"). As this time would contribute directly to the access time of the memory it is desirable that it be reduced as far as possible and to this end the cross-connected transistors 22 and 23 are provided connected in paths respectively from the conductors 7 and 8 to ground and having their gate respectively connected to the conductors 8 and 7. The transistors 22 and 23 respond to the voltages on the conductors 7 and 8 to conduct a greater current from the lower voltage conductor and a much smaller current from the higher voltage conductor, when the transistor 24 (and transistor 29) is conducting. It is important that a voltage differential sufficient to control the transistors 22 and 23 correctly is established between the conductors 7 and 8 by the storage element 2 before the transistors 22 and 23 are permitted to pass current, that is when the transistor 24 is switched on. In order to achieve the switching on of the transistor 24 at the earliest time that an adequate voltage differential exists between the conductors 7 and 8, the transistors 26 and 27, which are connected in parallel from the voltage $V_{cc}$ to the gate of the transistor 24, monitor the voltages on the conductors 7 and 8 so that one or other of the transistors 26 and 27 becomes conducting when the voltage on the corresponding one of the conductors 7 and 8 has been reduced sufficiently by the storage element 2 for reliable and correct operation of the transistors 22 and 23. Up till the time of conduction of one of the transistors 26 and 27 the gate of transistor 24 is at ground potential and the transistor non-conducting because it was discharged to ground by the transistor 28 when that was switched on by the PRECHARGE CLOCK.

As there is only one pair of transistors 22 and 23 for each column of storage element they can be made larger and therefore able to pass much higher currents than the storage elements from the conductors 7 and 8 so that output voltages in the correct ranges can be established on them more quickly. The transistors 26 and 27 monitoring the voltages on the conductors 7 and 8 can be provided with the same or slightly higher conduction threshold voltages as the transistors 22 and 23 so that when the transistor 24 is switched on the difference between the conductivities of the transistors 22 and 23 due to the voltages on the conductors 7 and 8 is clearly determined.

It will be apparent that the circuit described above can provide the optimum timing of the switching on of the transistor 24 and therefore the earliest operation of the cross-connected transistors 22 and 23 giving reliable operation of those transistors. The circuit can therefore produce the minimum possible access time for reading from a random access memory.

The FIGURE shows only part of one column of storage elements of a memory which might have many such columns. The memory might have, for example, 1024 storage elements in each column and the row select conductors may be energised by a suitable decoder matrix, so that only 10 bits of input data are needed to identify a particular row.

Although the invention has been described with reference to only a single embodiment it will be understood that many changes could be made to the embodiment without departing from the invention.

What we claim is:

1. A random access memory comprising:
   a plurality of data storage elements each able to store one bit of data and to produce complementary output current signals representing the stored bit when addressed;
   a pair of output conductors respectively for receiving the complementary output signals;
   means for charging the output conductors to a predetermined voltage; and,
   a pair of field effect devices each connected to discharge a respective output conductor in response to the voltage on the other output conductor after the output signals from an addressed storage element have been applied to the output conductors thereby to discharge fully the voltage on that one of the output conductors having the lower voltage due to the output signals from the addressed storage element, wherein there are provided means responsive to the voltages on the output conductors due to the output signals from an addressed storage element to enable said pair of field effect devices to pass current when the voltages on the output conductors have reached values capable of causing reliable switching of the pair of transistors.

2. A memory according to claim 1 wherein:
   said means responsive to the voltages on said output conductors include a second pair of field effect devices having gates respectively connected to the output conductors and sources connected to a reference voltage substantially equal to said predetermined voltage, wherein one or other of said second pair of field effect devices becomes conducting when the voltage on the output conductor to which its gate is connected has reached a value insuring reliable switching of said first pair of field effect devices; and means responsive to conduction by either of said second pair of field effect devices to enable said first pair of field effect devices to pass current.

3. A memory according to claim 2 wherein said means responsive to conduction by either of said second pair of field effect devices includes a further field effect device, the source-drain path of which is connected in series with the source-drain paths of said first pair of field effect devices so that when said further field effect device becomes conductive said first pair of field effect devices can pass current, and means for pre-charging the gate of said further field effect device so that it is non-conducting, the drains of the second pair of field effect devices being connected to the gate of the further field effect device so as to discharge it when the second pair of field effect device becomes conducting.

4. A memory according to claim 1 wherein each of said storage elements includes two CMOS amplifiers arranged in a bistable circuit having complementary output signals respectively connected to said pair of output conductors.

5. A memory according to claim 4 wherein each storage element includes two field effect devices responsive to the voltage on a selected row conductor to connect the ouput signals to said pair of output conductors when the row is selected and said selected row conductor is energised.

6. A memory according to claim 5 including input means for applying complementary voltages representing an input binary digit to said output conductors and for disabling said first pair of field effect devices thereby to enable the input digit to be stored in a data storage element selected by energisation of a row conductor.

* * * * *